United States Patent [19]

Lymn

[11] Patent Number: 5,876,499
[45] Date of Patent: Mar. 2, 1999

[54] SOLDER SPRAY LEVELLER

[76] Inventor: Peter P. Lymn, Limeworks Cottage, Kiln Lane, Buriton, Petersfield, Hampshire GU32, 1 QN, United Kingdom

[21] Appl. No.: 691,851

[22] Filed: Sep. 9, 1996

Related U.S. Application Data

[63] Continuation-in-part of Ser. No. 146,094, filed as PCT/GB92/00821, Jun. 6, 1997, Pat. No. 5,554,412.

[30] Foreign Application Priority Data

May 8, 1991 [GB] United Kingdom ............... 9109899

[51] Int. Cl.$^6$ ...................................................... B23K 3/06
[52] U.S. Cl. ............................................................ 118/316
[58] Field of Search ................................ 228/37; 118/316, 118/404, 424

[56] References Cited

U.S. PATENT DOCUMENTS

| | | | |
|---|---|---|---|
| 4,709,846 | 12/1987 | Eldenberg | 228/37 X |
| 4,928,869 | 5/1990 | Lymn | 228/20.1 |
| 5,038,706 | 8/1991 | Morris | 228/37 X |
| 5,222,650 | 6/1993 | Lymn | 228/20.1 |
| 5,614,264 | 3/1997 | Himes | 118/316 |

*Primary Examiner*—Kenneth J. Ramsey
*Attorney, Agent, or Firm*—Ware, Fressola, Van Der Sluys & Adolphson LLP

[57] ABSTRACT

An improved horizontal solder leveller for applying molten solder to boards while removing residual flux therefrom include a single pair of upper and lower solder sparge bars with outlet nozzles arranged so as to direct solder jets from one sparge bar toward the jets from the other sparge bar in the gap formed between the sparge bars. The gap between the sparge bars and the speed of the solder jets is sufficient to remove residual flux from a board passing therethrough as molten solder is applied to the board. An oil guide is included that directs oil to form curtains immediately upstream and downstream of the sparge bar gap to form a barrier to air flow in the gap. An oil trough upstream and downstream of the lower sparge bar limits the vertical extent of the oil curtains. Preferably a pair of castellated infeed rollers and outfeed rollers are used to move boards through the leveller.

10 Claims, 6 Drawing Sheets

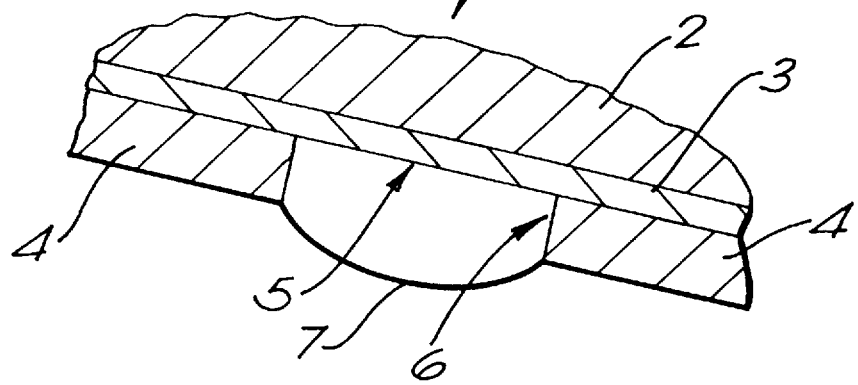
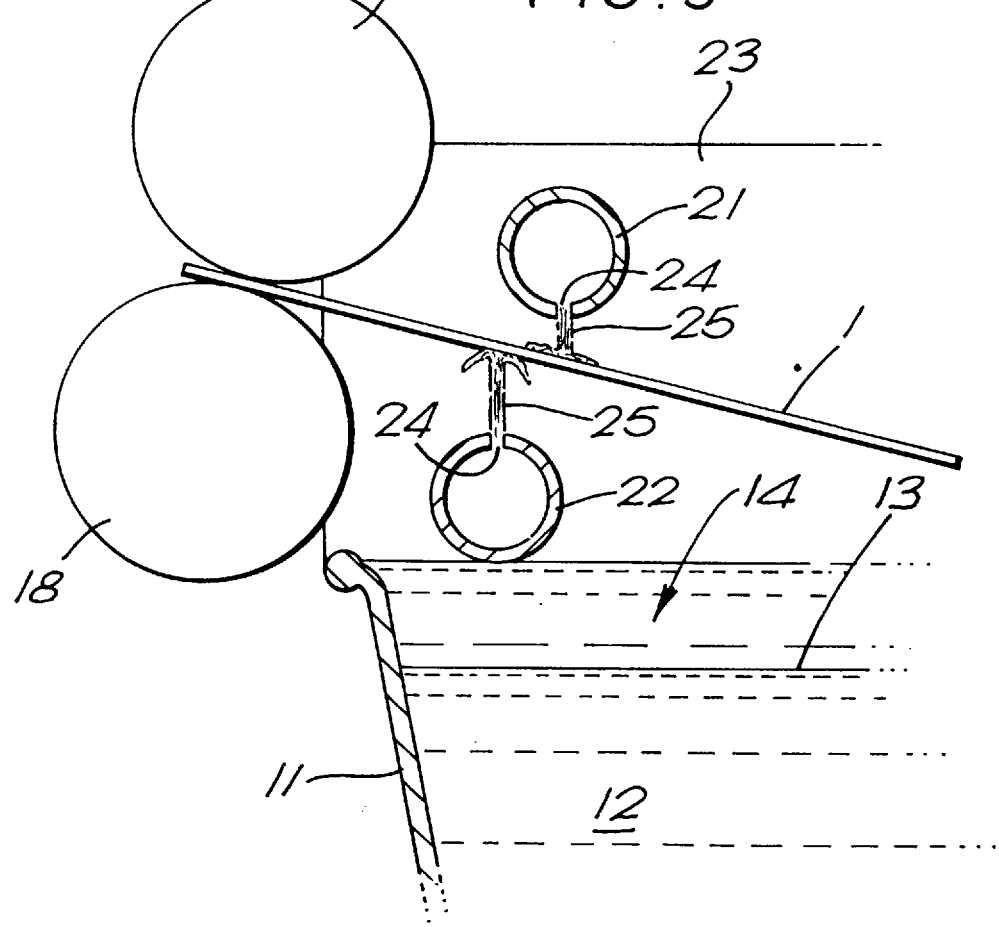

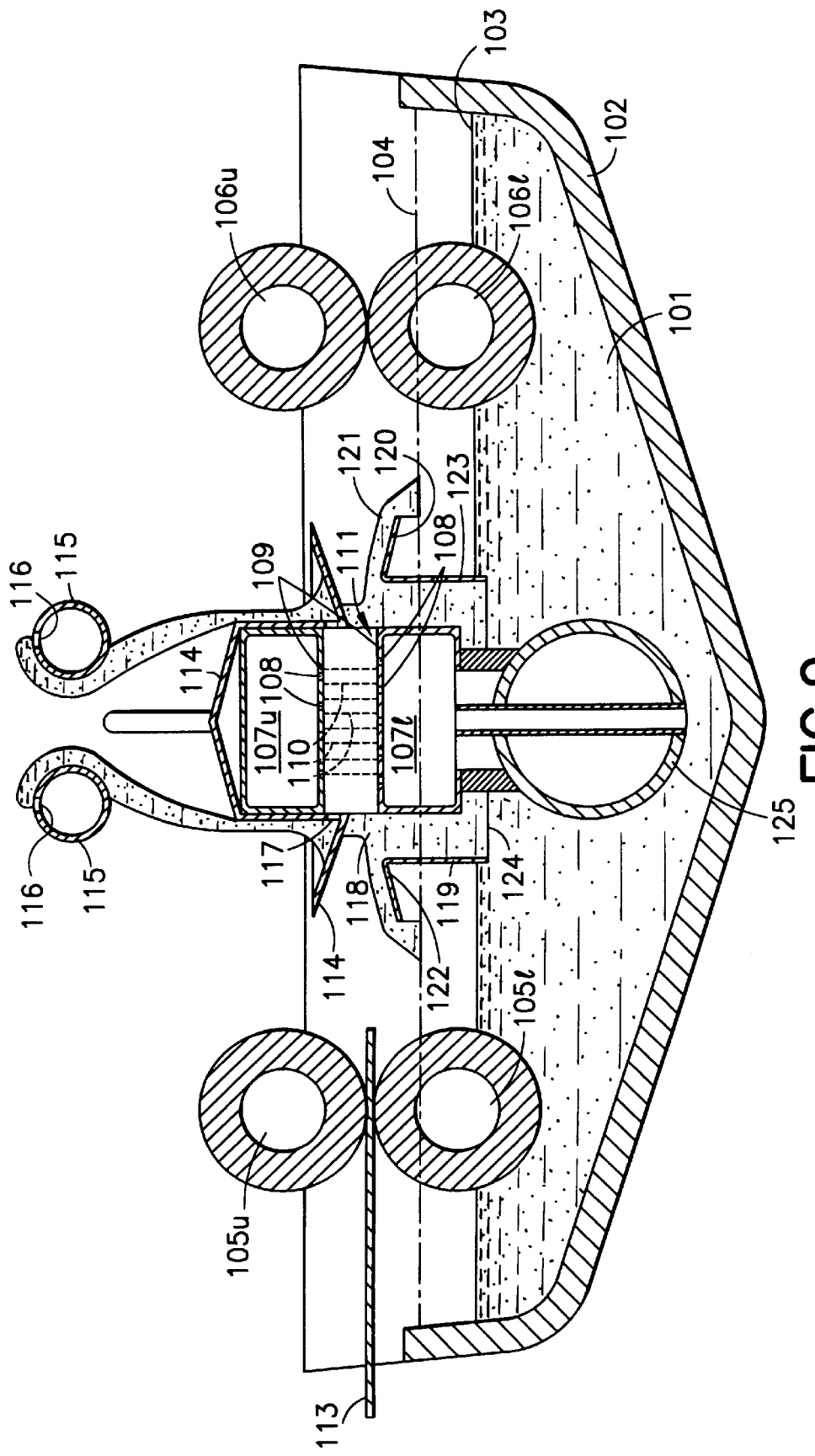

SOLDER SPRAY LEVELLER

This is a continuation-in-part of application(s) Ser. No. 08/146,094 filed on May 3, 1994 now U.S. Pat. No. 5,554,412 and International Application PCT/GB92/00821 filed on Jun. 6, 1997 and which designated the U.S.

FIELD OF THE INVENTION

The present invention relates to a horizontal solder leveller.

BACKGROUND OF THE INVENTION

The tern "horizontal solder leveller" means a machine through which printed circuit boards and the like (hereinafter called "boards") are passed substantially horizontally for application of molten solder and levelling of the applied solder. Accordingly such a machine comprises at least means for applying molten solder and means for levelling the applied solder. My early horizontal solder leveller is described in specification No: WO 87/07196, published on 3rd Dec., 1987, of my international patent application No: PCT/GB 87/00367.

My early horizontal solder leveller relies on passage of the board to be tinned beneath the surface of the molten solder in its solder bath. The board is passed between upper and lower tinning rollers, which at once—I believe —heat the board, assist transfer of solder onto the board and transport the board through the solder.

My early horizontal leveller has been developed as described in specification No: WO 91/06390, published on 16th May, 1991, of my international patent application No: PCT/GB 90/01685. The development included the provision of castellations in outfeed rollers for feeding the board from the solder bath to the air knives for levelling the solder applied to the board. The castellations allowed the air flow from the air knives to entrain oil, which can be sprayed onto these rollers, with the solder particles displaced from the board. This has assisted in keeping the machine clean and in returning the solder particles to the solder bath.

U.S. Pat. No. 4,563,974, issued on 14th Jan., 1986 to Monitrol, Inc., describes a horizontal solder leveller in which solder is poured onto the top surface of the board and is applied to the bottom surface of the board by a lower tinning roller. The solder application occurs entirely within flux oil and oil levelling is used.

Where boards include small pads for soldered contact with components, especially where the pads are for surface mount components, i.e. the pads do not have an associated bore through the board for a wire of the component to be soldered; a problem in tinning particularly with a horizontal leveller can arise of the solder not wetting some of the contact pads. I believe that this non-wetting results from the flux oil with which the board is preliminarily coated not being displaced by the solder.

It is conventional to include volatile chemicals in the flux oil. These are intended to vaporize as the board approaches the eutectic temperature of the solder and thus displace the oil from the contact pads. I have carried out extensive trials on these chemicals and concluded that they cannot be a complete solution to the problem of board pads not being completed wetted by solder in a horizontal leveller.

THE INVENTION

In my earlier version of the present invention, I passed the boards through a solder curtain or spray immediately upstream of the main solder application means in my solder leveller. Such a curtain or spray appears to assist the displacement of the oil and allows its replacement with the solder in the application means.

Vertically upwards flow has a more beneficial effect than downwards flow. I believe that this is because displacement of oil from contact pads on the underside of the board is inherently more difficult. The oil can not float away vertically once trapped beneath a substantially horizontal board. An upwards flow of solder onto these pads forcibly displaces oil from them.

Accordingly, the earlier version of my present invention discloses the horizontal solder leveller that includes:

means for providing an upwardly directed, distributed flow of solder, as a spray or curtain, through which the board can pass.

Whilst I originally believed that it was necessary to pass the circuit board through a preliminary solder spray or curtain before passing it through a main solder application means, I have now been surprised to discover that I can achieve complete wetting of copper on a board by passing it through a single spray or curtain performing the function of both the auxiliary and the main solder application means. This has been achieved with a solder contact time of 0.1 sec. i.e. individual parts of the board are in contact with the solder for only this length of time.

For this to work in completely displacing flux oil from the board, so allowing complete solder wetting of the board, I believe that it is necessary for the solder to be pumped at a sufficient speed in sufficient proximity to the board. Test have shown that a solder velocity towards the board of 0.8 metres per second from nozzle orifices 0.4 mm from the board will operate satisfactorily, However, I prefer to use a velocity of 1.0 m/s at a nozzle to board spacing of 0.3 mm.

According to the invention there is provided a horizontal solder leveller, in which the solder application means is a single pair of upper and lower solder sparge bars having solder outlet nozzles arranged to direct solder jets towards each other in the gap between the sparge bars.

Preferably the horizontal solder leveller includes means for applying oil to flow onto the upper solder sparge bar and forming oil curtains on the up- and down-stream sides of the sparge bars.

THE DRAWINGS

FIG. 1 is a scrap cross-sectional view on an enlarged scale of a contact pad of a printed circuit to be tinned;

FIG. 3 is a similar view on a larger scale of solder spray sparge bars in the solder leveller of FIG. 1;

FIG. 9 is a diagrammatic side view of the solder leveller of my present invention, showing the leveller in operation.

The earlier version of my invention is explained below and generally describes the operation of a solder leveller with auxiliary solder application means. My present invention, as described later, incorporates the function of the auxiliary solder application means with respect to removal of residual oil in the main solder application means.

Figure 2:
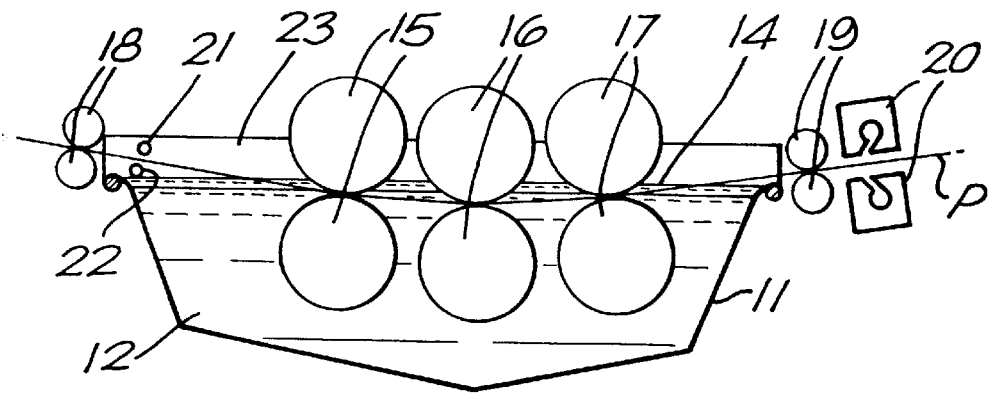
FIG. 2 is a diagrammatic side view of one solder leveller of an earlier version of my invention.
Figure 4:
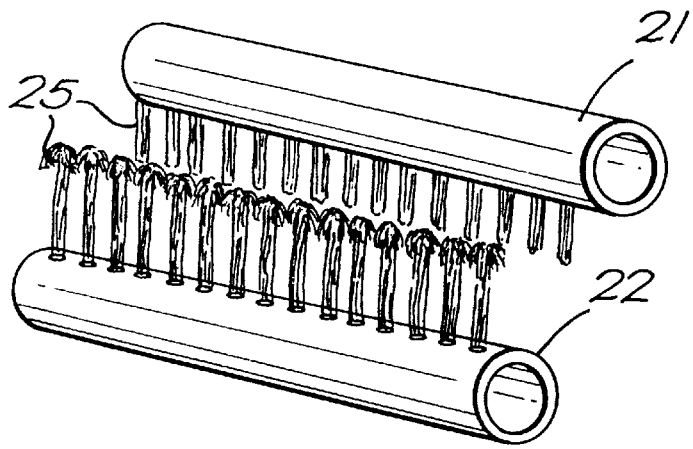
FIG. 4 is a scrap perspective view of solder spray flow from the sparge bars.

Referring first to FIG. 1, there is shown the under-side of a printed circuit board 1 at an angle of 8°, at which it approaches the solder bath 11 of the solder leveller shown in FIG. 2. On the substrate 2 of the board is laid a copper track 3 partially over-laid by a photo-resist mask 4 to leave exposed a contact pad 5. The board has been previously coated with an oil. This does not adhere to the mask 4, but does adhere to the contact pad 5 and completely fills the cavity 6 defined by the mask and the pad. The oil forms a meniscus 7 from the edges of the mask at the cavity. The surface tension of the oil is such that the cavity remains filled even when as shown in FIG. 1 the board is upside down. In a solder leveller such as described in my International patent application No: PCT/GB 89/01685, dated 2nd Nov., 1990, the oil in the cavity may be dragged under the surface of the solder and prevent the pad from being wetted by the solder.

Turning now to FIG. 2, the leveller there shown can be seen to have a bath 11 containing molten solder 12 having a free surface 13, over which there is a layer of oil 14. The leveller has three pairs of tinning rollers 15,16,17 having nips beneath the surface 13 of the solder. An infeed roller pair 18 and an outfeed roller pair 19 are provided. The rollers by their nips define a curved board path P through the leveller. Air knives 20 for levelling solder applied to a board during its passage through the bath via the rollers are provided downstream of the bath.

Above the solder and immediately downstream of the infeed rollers, two solder sparge bars 21,22 are provided. They are mounted in side walls 23 of the bath and extend transversely across the width of the board path, the upper bar 21 being above the board path and the lower bar 22 being below the path. The lower bar 22 is marginally upstream, in the sense of the movement of the board along the board path P, of the upper bar 21 whereby solder streams from each do not interfere with each other. The bars are in fact hollow tubes and are connected to a pump (not shown) for pumping solder from the bath to them. Along their length, the bars are provided with a plurality of apertures 24 through which the solder leaves them as a curtain or screen of individual streams 25. The apertures in the lower bar are directed upwardly and those in the upper bar are directed downwardly, to give a corresponding direction to the streams 25. Typically the apertures are of 1.5 mm diameter set at 3.0 mm pitch. The pressure, with which the solder is pumped, is sufficient to cause the jets from the lower bar to rise above the level of the board path between the sparge bars.

Previously to reaching the infeed rollers 18, a board to be tinned and levelled is coated with oil including flux to aid the tinning process. It is this oil which the invention removes from the contact pads, as opposed to the oil 14 overlying the solder 12 in the bath 11. Being comprised of a plurality of streams 25, the solder flow is turbulent and spreads in an uneven way over the upper and lower surfaces of the board 1 at the sparge bars 21,22. In so doing, it disturbs the oil menisci such as 7, and enters the cavities as far as the contact pads such as 5. The pads are likely to be only partially wetted by the solder at this stage. Complete tinning and formation of the itermetallic layer between the copper and the tin of the tin/lead solder occurs during the passage through the main solder bath 11.

Figure 5:
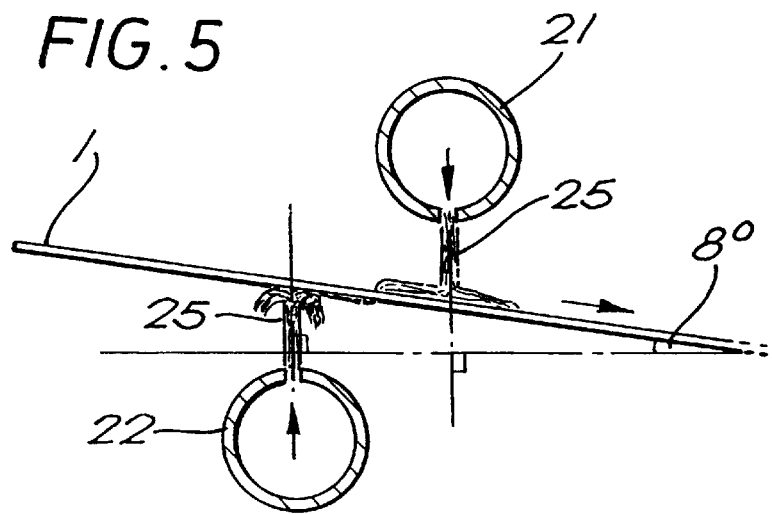
FIG. 5 is a scrap side view of the solder spray flow impinging on a board.

It will be seen from FIG. 5, that the generally vertical direction of the solder streams in combination with the angle of the board at the sparge bars, i.e. inclined downwards by 8°, causes the underneath, upwardly flowing streams to have a component of velocity backwards with respect to the forwards velocity of the board along the local direction of the board path. The upper sparge bar may be turned to give a similar effect.

The solder from the sparge bar streams falls back from the board 1 through the oil layer 14 into the bulk of the solder 12 in the bath 11. From the sparge bars 21,22 the board passes on along the board path P through the oil 14 into the solder 12 for tinning and thence to the air knives 20.

Figure 6:
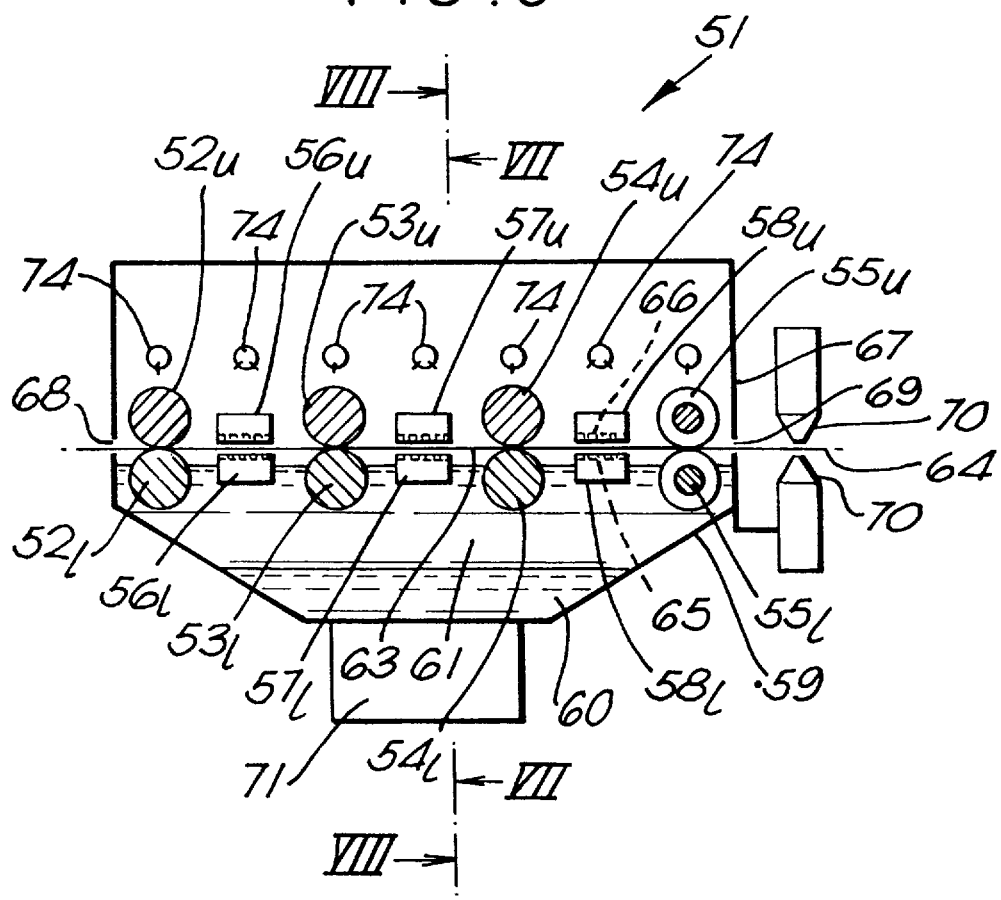
FIG. 6 is a diagrammatic cross-sectional side view of my solder leveller of an earlier version of my invention, taken on the line VI—VI in FIG. 7, without its solder and oil pumps being shown.
Figure 7:
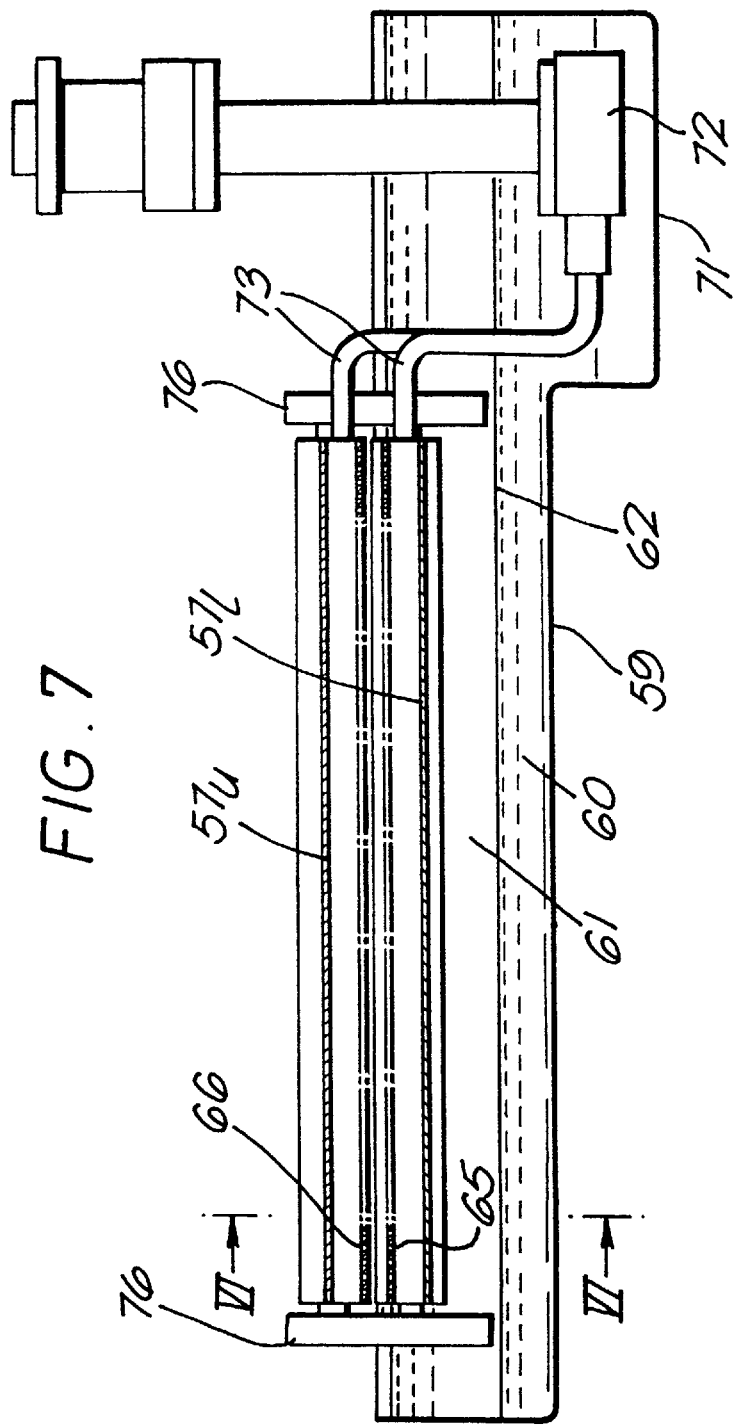
FIG. 7 is a diagrammatic cross-sectional view on the section line in FIG. 6, taken in the direction of the arrows VII—VII, and showing a solder pump.
Figure 8:
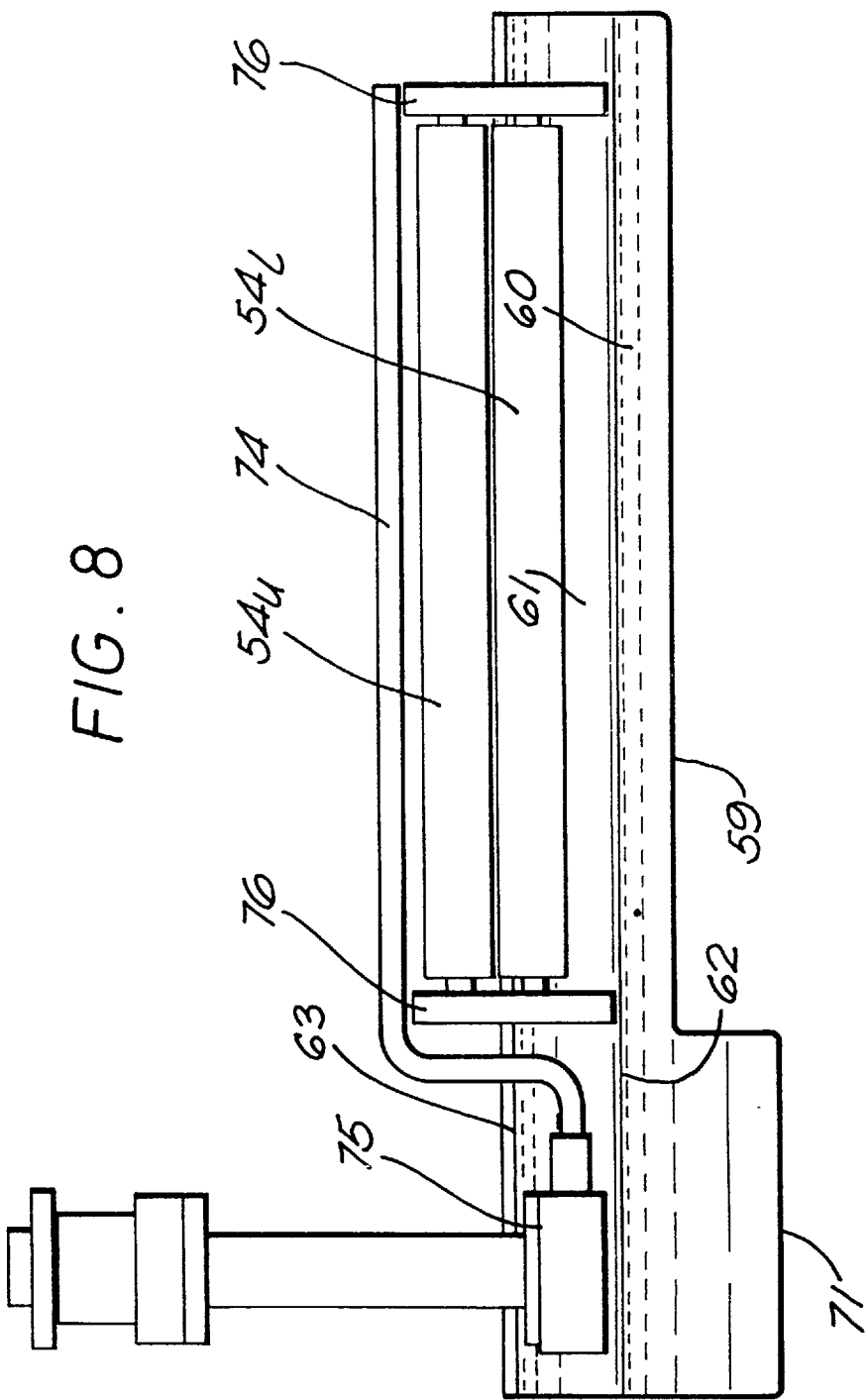
FIG. 8 is a view similar to FIG. 7, taken on the same section line in FIG. 6 but in the opposite direction, i.e. in the direction of the arrows VIII—VIII, and showing an oil pump.

Turning now to FIGS. 6,7 & 8, the solder leveller 51 thereshown utilizes solder sprays alone for applying solder. The leveller has four pairs of upper and lower transport rollers $52_u, 52_l, 53_u, 53_l, 54_u, 54_l, 55_u, 55_l$ and three pairs of upper and lower sparge bars $56_u, 56_l, 57_u, 57_l, 58_u, 58_l$. The lower ones of both of these are set at the top of a sump 59 for containing molten Solder 60 and flux oil 61. The top normal level 62 of the solder in the sump 59 is well below the rollers; but the normal top level 63 of the oil is close to the top of the sump 59, with the lower rollers three quarters immersed in the oil 61. The lower sparge bars are are also three quarters immersed in the oil. However it should be noted that the oil does not extend as high as the nip of the rollers at the level 64 of which boards pass through the leveller; nor does the oil cover the apertured top surface 65 of the lower sparge bars, let alone the apertured bottom surface 66 of the upper sparge bars. The sparge bars are hollow tubes with a multi-row array of apertures in their surfaces 65, 66. They are of a material not wetted by solder, as are the transport rollers.

A cowl 67 with air extraction apparatus (not shown) is provided over the sump and defines with it a board inlet 68 and a board outlet 69. Just downstream of the outlet 69, air knives 70 are provided, which direct levelling air at a board leaving the leveller. Due to the angling of the air orifices in the knives, most of the air flow from the knives 70 passes into the cowl 67, via the board outlet 69. The outfeed ones $55_u, 55_l$ of the transport rollers are castellated to allow passage of this air flow.

The solder sump has a rear extension in the form of a tank 71 in which is accommodated a solder pump 72 for drawing solder from the sump and passing it via pipes 73 to the upper and lower solder sparge bars. Provided above the rollers and the solder sparge bars are oil sparge bars 74, which are apertured to spray oil onto the upper rollers and to both sides of the sparge bars, to keep the rollers hot and clean and to keep the boards hot and coated in oil. The oil sparge bars are supplied with oil from an upper portion of the solder tank 71 via an oil pump 75. As shown in FIGS. 7 and 8, the solder sparge bars and the rollers extend between and are supported by side beams 76. The oil sparge bars are supported above the side beams. The entire sump and hence the solder and oil are heated by electric elements, which are not shown.

In use, both pumps 72,75 are in operation. A pre-fluxed board enters the leveller via the inlet 68 and passes into the nip of the first rollers $52_u, 52_l$. Thence it is passed on by the rollers, which are driven by non-shown drive arrangements, to the space between the first of the solder sparge bars $56_u, 56_l$ from which a spray of solder impinges on the board from above and below. The board's contact pads are contacted with solder, but not in sufficient quantity to cover them fully to a depth from which they can be levelled to a uniform solder thickness. The board is passed on to the second and third solder sparge bar pairs $57_u$, $57_l$, $58_u$, $58_l$ by the transport rollers $53_u$, $53_l$, $54_u$, $54_l$, $55_u$, $55_l$. Once the board passes out of the outlet 69, sufficient thickness of solder has built up from the second and third sparge bars for it to be levelled by the air knives 70. The oil spray from the oil sparge bars 74 maintain the upper rollers and the board above the eutectic point of the solder, keep the rollers clean from oxide deposit and entrain solder particles passing within the cowl from the levelling by the air knives.

IMPROVED SOLDER LEVELLER OF THE PRESENT INVENTION

My improved solder leveller is shown in FIG. 9.

In a solder leveller it is important to restrict the access of air to molten solder. To provide this in conjunction with a single solder application stage as shown in FIG. 9, I have designed an improved oil feed arrangement including:

i) oil guide means for directing tho oil to form curtains immediately up- and down-stream of the sparge bar gap to form a barrier to air flow between the sparge bars; and ii) an oil trough up- and down-stream of the lower sparge bar with a top substantially level with lower sparge bar for limiting the vertical extent of the oil curtains.

The solder bath shown in FIG. 9 will be used in conjunction with a pair of air knives as shown in FIG. 6. The bath 101 has a sump 102, with a static solder level 103 and a static oil level 104. A pair of castellated infeed rollers $105_u$, $105_l$ and a similar pair of castellated outfeed rollers $106_u$, $106_l$ are provided with the lower ones of the rollers dipping into the solder to assist in keeping the entire bath at a uniform temperature.

Centrally of the bath, a pair of upper and lower solder sparge bars $107_u$, $107_l$ are arranged with nozzles 108 in their respective lower and upper surfaces 109 for directing solder jots 110 towards each other at the gap 113 between the bars. The gap is set to provide a 0.3 mm spacing from the surfaces 109 to the respective surfaces of a board 113 when passing centrally between the sparge bars and being tinned by them. The preferred speed of the solder emanating from the jets is 1.0 M/sec.

A generally W shaped oil guide 114 is mounted on the upper sparge bar $107_u$ and fed from above with oil from two oil feed tubes 115. These have upwardly directed oil outlets 116—for ease of cleaning—from which oil flows down around the tubes into the guide 114. This has inwardly directed outlets 117 from the lower points of the W. Thence the oil flows downwards in continuous curtains 118 to a lower oil trough 119. This has wings 120 over which the oil flows in the up- and down-stream direction as a dynamic oil blanket 121. The wings slope gently downwards from their line 122 of connection with the trough walls 123. The line of connection is level with the top surface of the lower sparge bar, whereby the oil curtains 110 are of minimum height and maintain their integrity. The trough has an open bottom 124, whereby solder from the sparge bars can return to the bath for recirculation via a feed tube 125 and a pump (not shown). The solder forms a bottom of the trough as regards oil flow, because the head of oil in the trough is negligible in comparison with the pressure required to displace the dense solder from the trough. This arrangement ensures that air does not have free access to the solder flow from the sparge bars, so that oxidation of the solder is reduced.

The nozzles 108 are preferably provided as at least one row of circular bores, with the pitch staggered between the rows to ensure that all areas of a board passing them are impinged on by solder from one nozzle. However I envisage that the solder flow from a single row of bores may be sufficiently turbulent to cover the entire board surface. I envisage also that a continuous slot nozzle may be effective. Achieving a solder flow velocity of 1.0 m/g through the nozzles requires a volume flow rate of approximately 100 litres por minute at approximately 2 bar.

In summary the horizontal solder leveller of the present invention provides a single pair of upper and lower solder sparge bars having solder outlet nozzles arranged to direct solder jets towards each other in the gap between the sparge bars. By providing the solder at a flow rate and distance from the board as recited above, the leveller is able to remove residual oil from contact areas of the board to be soldered without the need of a separate auxiliary solder application means.

Having described the invention, what is claimed is:

1. A horizontal solder leveller for applying molten solder to a board comprising:

main solder application means for applying molten solder to said board;

first means for directing a board into the solder leveller;

second means for directing a board out of the solder leveller; wherein the main solder application means is between said first and second directing means, and wherein the main solder application means is a single pair of upper and lower solder sparge bars spaced from each other so as to form a gap therebetween, each sparge bar having a plurality of solder outlet nozzles arranged so as to direct solder jets towards the solder jets of the other sparge bar in the gap formed between the sparge bars, and wherein the flow rate of the solder in said jets is sufficient to remove residual flux from a board passing therethrough as the molten solder is applied to the board.

2. A horizontal solder leveller as claimed in claim 1, including means for applying oil to flow onto the upper solder sparge bar so as to form oil curtains on the upstream and downstream sides of the sparge bars.

3. A horizontal solder leveller as claimed in claim 2, including oil guide means for directing the oil to form curtains immediately upstream and downstream of the sparge bar gap to form a barrier to air flow between the sparge bars.

4. A horizontal solder leveller as claimed in claim 3, including an oil trough upstream and downstream of the lower sparge bar with a top substantially level with lower sparge bar for limiting the vertical extent of the oil curtains.

5. A horizontal solder leveller as claimed in claim 4, wherein the means for applying oil includes oil feed tubes positioned above the upper sparge bar and a generally W shaped oil guide mounted on the upper sparge bar and fed from above with oil from the oil feed tubes.

6. A horizontal solder leveller as claimed in claim 5, wherein the gap between the sparge bars is such that the space between the outlet nozzles of the sparge bars and the board passing therebetween is approximately 0.3 mm.

7. A horizontal solder leveller as claimed in claim 6, wherein the solder jets have a speed of approximately 1.0 meters/second.

8. A horizontal solder leveller as claimed in claim 7, wherein the first means for directing a board into the solder leveller causes the board to pass between the sparge bars so that each portion of the board is between the solder jets for approximately 0.1 second.

9. A horizontal solder leveller as claimed in claim 2, wherein the means for applying oil includes oil feed tubes positioned above the upper sparge bar and a generally W shaped oil guide mounted on the upper sparge bar and fed from above with oil from the oil feed tubes.

10. A horizontal solder leveller as claimed in claim 1, wherein the gap between the sparge bars is such that the space between the outlet nozzles of the sparge bars and the board passing therebetween is approximately 0.3 mm.

* * * * *

UNITED STATES PATENT AND TRADEMARK OFFICE
CERTIFICATE OF CORRECTION

PATENT NO. : 5,876,499
DATED : March 2, 1999
INVENTOR(S) : Peter P. Lynn

It is certified that error appears in the above-identified patent and that said Letters Patent is hereby corrected as shown below:

In column 1, line 6, "June 6, 1997" should be --May 6, 1992--.
In column 4, line 23, "Solder" should be --solder--.

In column 6, line 15, "por" should be --per--.

Signed and Sealed this

Tenth Day of August, 1999

Attest:

Q. TODD DICKINSON

Attesting Officer

Acting Commissioner of Patents and Trademarks